United States Patent
Do et al.

(10) Patent No.: US 8,143,102 B2
(45) Date of Patent: Mar. 27, 2012

(54) INTEGRATED CIRCUIT PACKAGE SYSTEM INCLUDING DIE HAVING RELIEVED ACTIVE REGION

(75) Inventors: Byung Tai Do, Singapore (SG); Sang-Ho Lee, Yeoju (KR); Jong Wook Ju, Icheon-si (KR)

(73) Assignee: STATS ChipPAC Ltd., Singapore (SG)

( * ) Notice: Subject to any disclaimer, the term of this patent is extended or adjusted under 35 U.S.C. 154(b) by 381 days.

(21) Appl. No.: 12/235,111

(22) Filed: Sep. 22, 2008

(65) Prior Publication Data
US 2009/0091042 A1    Apr. 9, 2009

Related U.S. Application Data

(60) Provisional application No. 60/977,469, filed on Oct. 4, 2007.

(51) Int. Cl.
*H01L 21/44* (2006.01)
*H01L 21/48* (2006.01)
*H01L 21/50* (2006.01)
*H01L 23/02* (2006.01)
*H01L 23/48* (2006.01)
*H01L 23/52* (2006.01)
*H01L 29/40* (2006.01)

(52) U.S. Cl. . 438/109; 257/678; 257/777; 257/E21.509; 257/E23.024

(58) Field of Classification Search .......... 257/678–796, 257/E23.024, E21.509; 438/109
See application file for complete search history.

(56) References Cited

U.S. PATENT DOCUMENTS

| | | | |
|---|---|---|---|
| 6,351,028 B1 * | 2/2002 | Akram | 257/686 |
| 6,388,313 B1 | 5/2002 | Lee et al. | |
| 6,472,758 B1 | 10/2002 | Glenn et al. | |
| 6,657,290 B2 | 12/2003 | Fukui et al. | |
| 6,977,439 B2 | 12/2005 | Kang et al. | |
| 7,067,927 B1 | 6/2006 | Mostafazadeh | |
| 7,652,376 B2 * | 1/2010 | Park et al. | 257/737 |
| 2005/0146005 A1 * | 7/2005 | Shimoishizaka et al. | 257/678 |
| 2005/0161788 A1 * | 7/2005 | Shizuno | 257/678 |
| 2006/0087013 A1 | 4/2006 | Hsieh | |
| 2006/0197203 A1 | 9/2006 | Chu et al. | |
| 2007/0108574 A1 * | 5/2007 | Kang et al. | 257/678 |
| 2007/0108621 A1 | 5/2007 | Park | |
| 2009/0278265 A1 * | 11/2009 | Imanishi et al. | 257/787 |

* cited by examiner

*Primary Examiner* — David S Blum
(74) *Attorney, Agent, or Firm* — Mikio Ishimaru

(57) ABSTRACT

An integrated circuit package system includes: providing a substrate; attaching a base die to the substrate, the base die having a relief region with a shaped cross-section; and connecting a bond wire between an active base surface of the base die and the substrate, the bond wire extending through the shaped cross-section of the relief region.

20 Claims, 6 Drawing Sheets

INTEGRATED CIRCUIT PACKAGE SYSTEM INCLUDING DIE HAVING RELIEVED ACTIVE REGION

CROSS-REFERENCE TO RELATED APPLICATION(S)

This application claims the benefit of U.S. Provisional Patent Application Ser. No. 60/977,469 filed on Oct. 4, 2007, and the subject matter thereof is hereby incorporated herein by reference thereto.

TECHNICAL FIELD

The present invention relates generally to integrated circuit package systems, and more particularly to a multi-chip package system.

BACKGROUND ART

In the electronics industry, as products such as cell phones and camcorders become smaller and smaller, increased miniaturization of integrated circuit (IC) or chip packages has become more and more critical. At the same time, higher performance and lower cost have become essential for new products.

Usually, many individual integrated circuit devices are constructed on the same wafer and groups of integrated circuit devices are separated into individual integrated circuit die.

One approach to putting more integrated circuit dies in a single package involves stacking the dies with space between the dies for wire bonding. The space is achieved by means of a thick layer of organic adhesive or in combination with inorganic spacers of material such as silicon (Si), ceramic, or metal. Unfortunately, the stacking adversely affects the performance of the package because of decreased thermal performance due to the inability to remove heat through the organic adhesive and/or inorganic spacers. As the number of dies in the stack increases, thermal resistance increases at a faster rate. Further, such stacked dies have a high manufacturing cost.

Generally, semiconductor packages are classified into a variety of types in accordance with their structures. In particular, semiconductor packages are classified into an in-line type and a surface mount type in accordance with their mounting structures. Examples of in-line type semiconductor packages include a dual in-line package (DIP) and a pin grid array (PGA) package. Examples of surface mount type semiconductor packages include quad flat package (QFP) and a ball grid array (BGA) package.

Various types of bonding problems have been encountered with stacked dies. One potential problem is with bond wires shorting to the bottom die due to bond wire sagging during top die bonding. The actual failure mode shows electrical shorting by wire sagging is very critical and occurs frequently in mass production. This problem is especially acute in reverse bonding of the wire bond at the top of the bottom die.

Another type of potential problem is with bond wire shorting to the top die due to higher loop height of the bond wire than expected. This problem is especially acute in normal bonding of the wire bond at the top of the bottom die.

Recently, the use of surface mount type semiconductor packages has increased, as compared to in-line type semiconductor packages, in order to obtain an increased element mounting density of a package board. A conventional semiconductor package has a size considerably larger than that of the semiconductor chip used. For this reason, this semiconductor package cannot meet the recent demand for a light, thin, simple, miniature structure. As a result, it is hard for the conventional semiconductor package to meet the demand for a highly integrated miniature structure.

Furthermore, the fabrication method used to fabricate the conventional semiconductor package involves a relatively large number of processes. For this reason, a need therefore exists for reducing the costs through use of simplified processes. In view of the ever-increasing need to save costs and improve efficiencies, it is more and more critical that answers be found to these problems. Solutions to these problems have been long sought but prior developments have not taught or suggested any solutions and, thus, solutions to these problems have long eluded those skilled in the art.

DISCLOSURE OF THE INVENTION

The present invention includes an integrated circuit package system that provides a substrate; attaching a base die to the substrate, the base die having a relief region with a shaped cross-section; and connecting a bond wire between an active base surface of the base die and the substrate, the bond wire extending through the shaped cross-section of the relief region.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
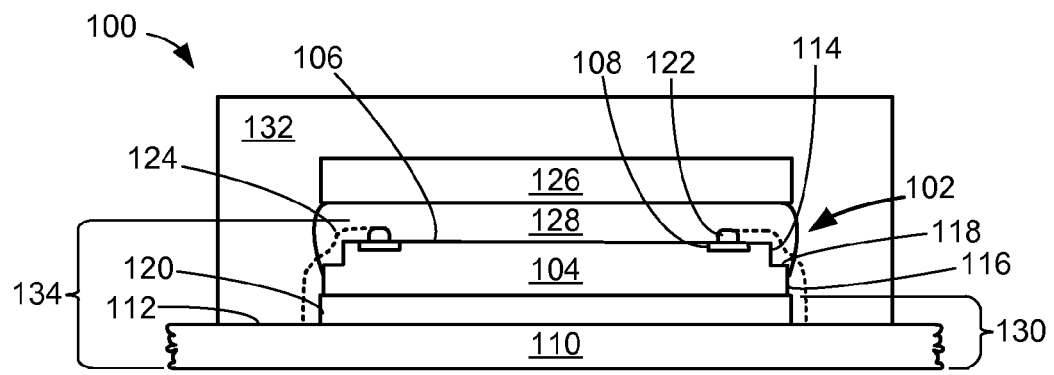
FIG. 1 is a cross-sectional view of an integrated circuit package system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 2:
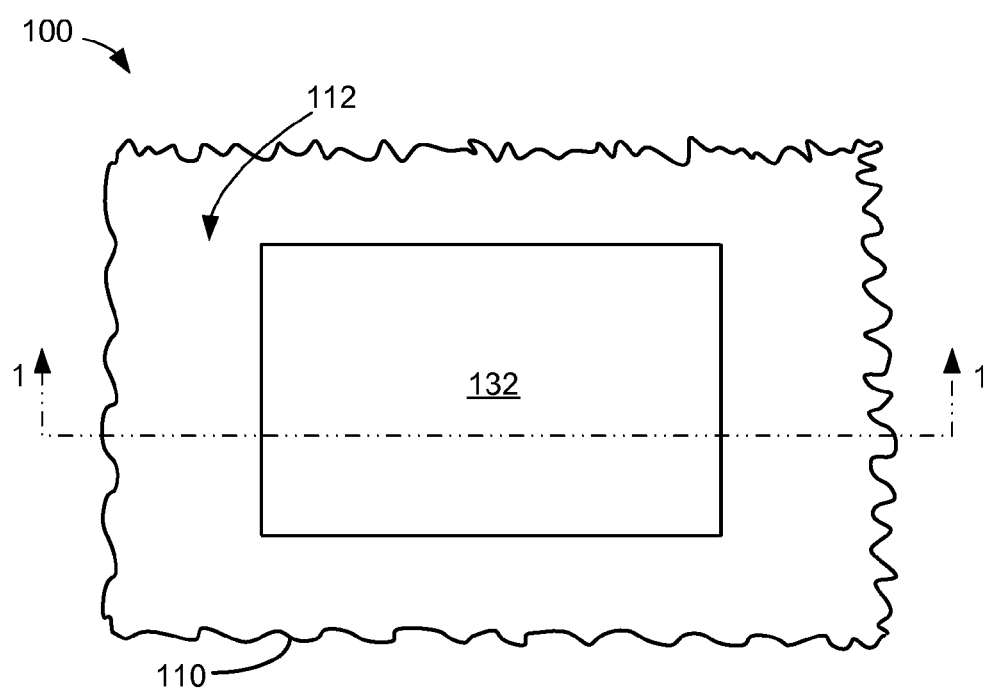
FIG. 2 is a top view of integrated circuit package system in the first embodiment of the present invention.

Referring now to FIG. 1, therein is shown a cross-sectional view of an integrated circuit package system 100 taken along line 1-1 of FIG. 2 in a first embodiment of the present invention. The integrated circuit package system 100 can preferably include a relief region 102, a base die 104 having an active base surface 106 with bond pads 108, and a substrate 110 having an active substrate surface 112. The relief region 102 can be formed by removal of material from the base die 104 and the active base surface 106 adjacent the bond pads 108.

The relief region 102 can include a vertical recess surface 114 parallel to a base die side 116 nearest the bond pads 108. The relief region 102 can also include a horizontal recess surface 118 parallel to the active base surface 106 and located below the active base surface 106 of the base die 104. The intersection of the vertical recess surface 114 and the horizontal recess surface 118 can form a line indicating a predetermined depth the horizontal recess surface 118 is below the active base surface 106 and a predetermined length the vertical recess surface 114 is from the base die side 116 of the base die 104 nearest the vertical recess surface 114.

The relief region 102 having the vertical recess surface 114 and the horizontal recess surface 118 can form a shaped cross-section having a rectangular geometric form. The shaped cross-section of the relief region 102 is non-restrictive and can result in any geometric form. The geometric form can be derived from combinations of orthogonal, curved, faceted, carved, textured, or other similar surface shapes thereof.

The shaped cross-section of the relief region 102 can be selected based on requirements such as available manufacturing processes, costs, application, or similar trade-off. The side opposite the active base surface 106 of the base die 104 can be attached to the active substrate surface 112 of the substrate 110 using a base attachment layer 120 such as a die adhesive. The base die side 116 and the relief region 102 are above the base attachment layer 120 on the active substrate surface 112. The bond pads 108 can provide connectivity between the circuitry of the base die 104 and the active substrate surface 112 of the substrate 110 using bond wires 124. The bond wires 124 can be connected to the bond pads 108 using stitch bonds 122.

The bond wires 124 having the stitch bonds 122 can extend away from the stitch bonds 122, parallel to the active base surface 106 and routed within or through the inside of the relief region 102. The bond wires 124 can be located within a predetermined distance from the vertical recess surface 114 and the horizontal recess surface 118. The substrate 110 can consist of a printed circuit board having connectivity to other components such as modules, connectors, display indicators, switches, or similar components typically associated with a next level of integration. It is noted that the substrate 110 is not limited and could consist of a package substrate to form a device attached to a next level of integration.

A stacking die 126 having circuitry with provisions for electrical connectivity can be mounted over the active base surface 106 of the base die 104 using a stacking attachment layer 128 such as a stacking adhesive laminate or coating. A base assembly 130 can consist of the substrate 110 having a portion of the active substrate surface 112 covered with the base attachment layer 120. An encapsulant 132 can optionally be applied over the stacking die 126, the bond wires 124, and the active substrate surface 112 adjacent the base die 104 to provide protection for the integrated circuit package system 100.

The encapsulant 132 could be omitted if a protection is provided at a next level of system integration such as with a metallic containment cap over the stacking die 126 and other adjacent next level circuitry on the substrate 110. A base die assembly 134 can consist of the base die 104 attached on the base assembly 130 having connectivity between the base die 104 and the base assembly 130 using the bond wires 124.

It has been unexpectedly discovered that circuitry performance can be greatly improved due to the reduced inductive effects from reduced lengths and proximity to the base die 104 attributed to routing of the bond wires 124.

Referring now to FIG. 2, therein is shown a top view of integrated circuit package system 100 in the first embodiment of the present invention. Shown are the encapsulant 132 and the active substrate surface 112. The encapsulant 132 covers part of the active substrate surface 112 of the substrate 110. Note that only a portion of the substrate 110 adjacent the encapsulant 132 is shown. Other components that may be attached on to the substrate 110 are not show for illustrative clarity.

Figure 3:
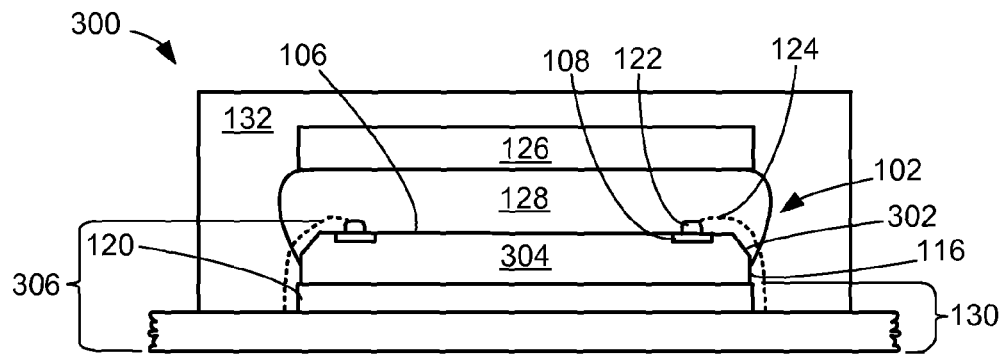
FIG. 3 is a cross-sectional view similar to FIG. 1 of an integrated circuit package system in a second embodiment of the present invention.

Referring now to FIG. 3, therein is shown a cross-sectional view similar to FIG. 1 of an integrated circuit package system 300 in a second embodiment of the present invention. The integrated circuit package system 300 can preferably include the relief region 102, a base die 304 having the active base surface 106 with the bond pads 108, and the base assembly 130. The relief region 102 can be formed by removal of material from the base die 304 and the active base surface 106 adjacent the bond pads 108.

The relief region 102 can include an angled recess surface 302 from adjacent the bond pads 108 to the base die side 116 nearest the bond pads 108. The angled recess surface 302 can be formed having a pre-determined angle oblique to the base die side 116 nearest the bond pads 108. The relief region 102 having the angled recess surface 302 can form a shaped cross-section having a triangular geometric form. The side opposite the active base surface 106 of the base die 304 can be attached on the base attachment layer 120 of the base assembly 130. The base die side 116 and the relief region 102 are above the base assembly 130.

The bond pads 108 can provide connectivity between the circuitry of the base die 304 and the base assembly 130 using the bond wires 124. The bond wires 124 can be connected to the bond pads 108 using the stitch bonds 122. The bond wires 124 can be routed within or through the inside of the relief region 102. The bond wires 124 can be located within a predetermined distance from the angled recess surface 302. The stacking die 126 can be mounted over the active base surface 106 of the base die 304 using the stacking attachment layer 128. The encapsulant 132 can optionally be applied over the stacking die 126, bond wires 124, and surrounding portions of the base assembly 130.

A base die assembly 306 can consist of the base die 304 attached on the base assembly 130 having connectivity between the base die 304 and the base assembly 130 using the bond wires 124.

Figure 4:
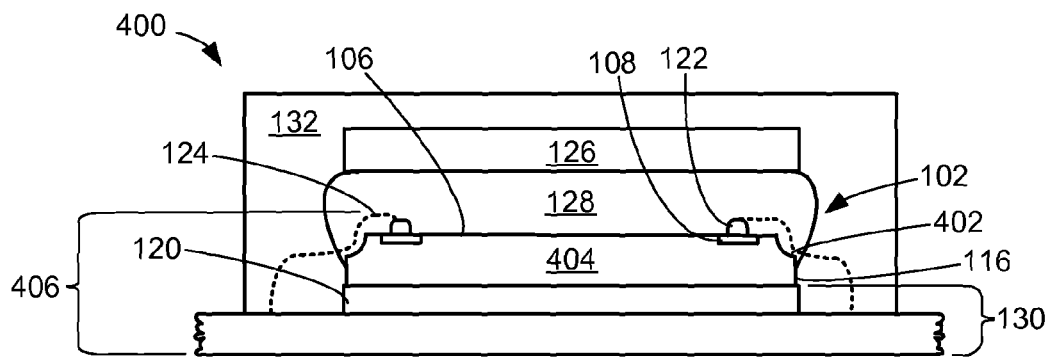
FIG. 4 is a cross-sectional view similar to FIG. 1 of an integrated circuit package system in a third embodiment of the present invention.

Referring now to FIG. 4, therein is shown a cross-sectional view similar to FIG. 1 of an integrated circuit package system 400 in a third embodiment of the present invention. The integrated circuit package system 400 can preferably include the relief region 102, a base die 404 having the active base surface 106 with the bond pads 108, and the base assembly 130. The relief region 102 can be formed by removal of material from the base die 404 and the active base surface 106 adjacent the bond pads 108.

The relief region 102 can include an angled curved recess surface 402 from adjacent the bond pads 108 to the base die side 116 nearest the bond pads 108. The angled curved recess surface 402 can be formed having a pre-determined angle oblique to the base die side 116 nearest the bond pads 108. The angled curved recess surface 402 can include having a surface curved into the base die 404 resulting in a depressed surface. The relief region 102 having the angled curved recess surface 402 can form a shaped cross-section having a rounded geometric form.

The side opposite the active base surface 106 of the base die 404 can be attached on the base attachment layer 120 of the base assembly 130. The base die side 116 and the relief region 102 are above the base assembly 130. The bond pads 108 can provide connectivity between the circuitry of the base die 404 and the base assembly 130 using the bond wires 124. The bond wires 124 can be connected to the bond pads 108 using the stitch bonds 122. The bond wires 124 can be routed within or through the inside of the relief region 102. The bond wires 124 can be located within a predetermined distance from the angled curved recess surface 402. The stacking die 126 can be mounted over the active base surface 106 of the base die 404 using the stacking attachment layer 128.

The encapsulant 132 can optionally be applied over the stacking die 126, bond wires 124, and surrounding portions of the base assembly 130. A base die assembly 406 can consist of the base die 404 attached on the base assembly 130 having connectivity between the base die 404 and the base assembly 130 using the bond wires 124.

Figure 5:
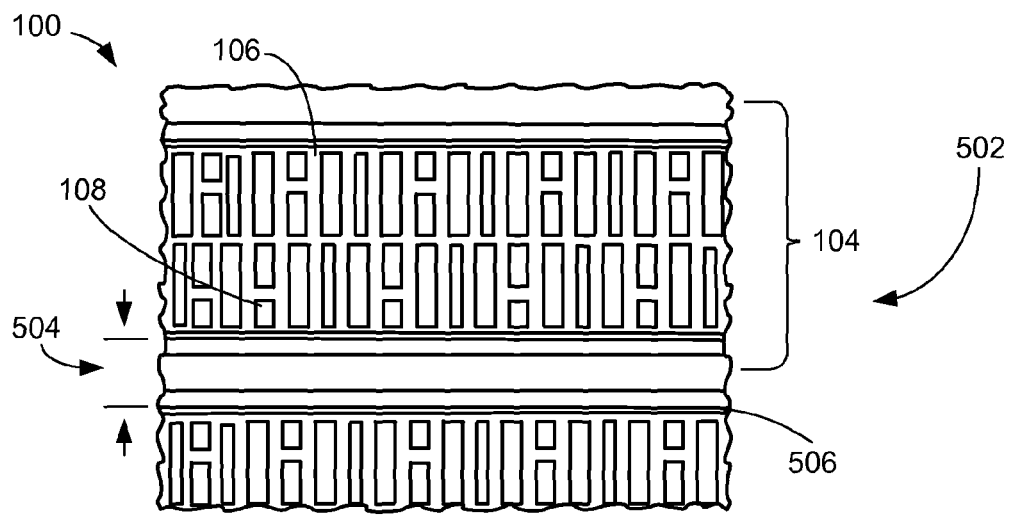
FIG. 5 is a top plan view of aggregate dice in accordance with the first embodiment of the present invention.

Referring now to FIG. 5, therein is shown a top plan view of aggregate dice in accordance with the first embodiment of the present invention. Shown is a portion of a wafer 502 having one of several replications of the base die 104 prior to individual singulation, the bond pads 108 exposed adjacent the active base surface 106, saw streets 504, and scribe seals 506. The scribe seals 506 can be used to provide isolation and protection to the circuitry of the wafer 502 during the manufacturing build processes.

The saw streets 504 can be used to separate individual dice during a singulation process using methods such as sawing, grinding, laser, water jet, or any other available singulation method.

Figure 6:
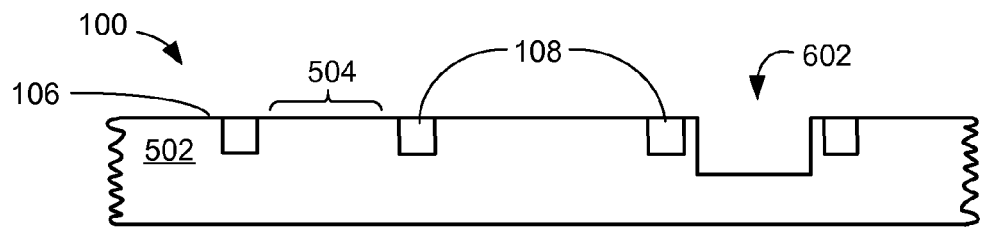
FIG. 6 is a schematic illustration of steps in the manufacture of the first embodiment.

Referring now to FIG. 6, therein is shown a schematic illustration of steps in the manufacture of the first embodiment. Shown is a partial schematic side view illustration of the wafer 502, the bond pads 108, and the saw streets 504. Open chamfers 602 can be formed by removal of part or all of the saw streets 504 adjacent the bond pads 108 as well as removal of material below the saw streets 504 using a step removal process such as grinding, cutting, or equivalent material removal processes. The material is removed to a predetermined depth below the active base surface 106.

Figure 7:
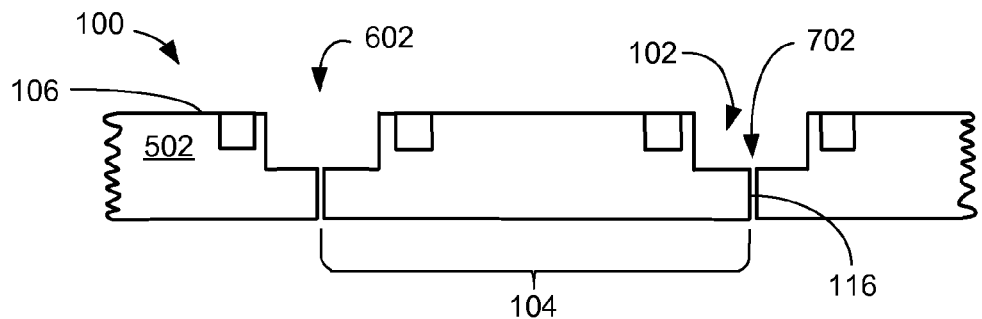
FIG. 7 is a schematic illustration of other steps in the manufacture of the first embodiment.

Referring now to FIG. 7, therein is shown a schematic illustration of other steps in the manufacture of the first embodiment. Shown is a partial schematic illustration of the wafer 502, open chamfers 602, and the base die side 116. A continuation of the step removal process includes vertical wafer cuts 702 applied using a singulation process such as sawing, grinding, or equivalent cutting processes. The vertical wafer cuts 702 vertically transverse the wafer 502 resulting in complete singulation of the wafer 502 along each of the vertical wafer cuts 702.

The base die 104 having the relief region 102 of FIG. 1 can be formed from the wafer 502 by application of the singulation process to the open chamfers 602 of the wafer 502.

Figure 8:
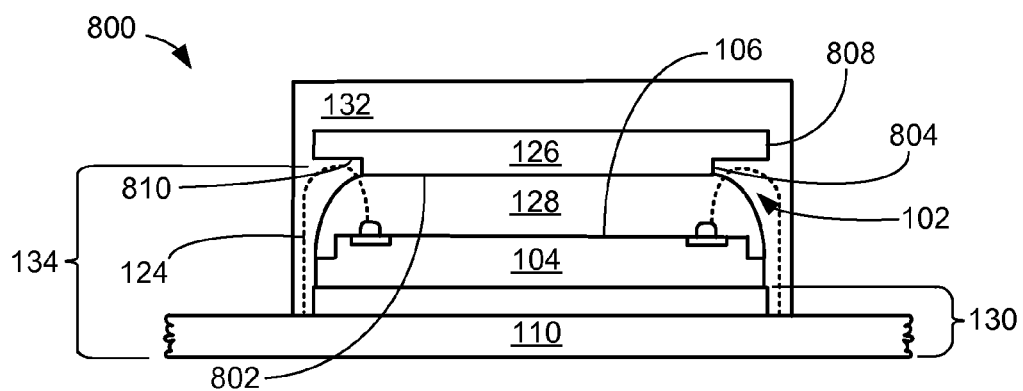
FIG. 8 is a cross-sectional view similar to FIG. 1 of an integrated circuit package system in a fourth embodiment of the present invention.

Referring now to FIG. 8, therein is shown a cross-sectional view similar to FIG. 1 of an integrated circuit package system 800 in a fourth embodiment of the present invention. The integrated circuit package system 800 can preferably include the base die assembly 134, the stacking attachment layer 128, and the stacking die 126 having the relief region 102 located adjacent a backside surface 802 of the stacking die 126. The relief region 102 can include a vertical recess surface 804 parallel to a stacking die side 808 of the stacking die 126.

The relief region 102 can also include a horizontal recess surface 810 parallel to the backside surface 802. The intersection of the vertical recess surface 804 and the horizontal recess surface 810 can form a line indicating a predetermined height the horizontal recess surface 810 is above the backside surface 802 and a predetermined length the vertical recess surface 804 is away from the stacking die side 808 nearest the vertical recess surface 804. The predetermined length the vertical recess surface 804 is from the stacking die side 808 can be greater than the predetermined height the horizontal recess surface 810 is above the backside surface 802.

The relief region 102 having the vertical recess surface 804 and the horizontal recess surface 810 can form a shaped cross-section having a rectangular geometric form. The bond wires 124 of the base die assembly 134 connecting the active base surface 106 of the base die 104 with the substrate 110 can extend through the relief region 102 of the stacking die 126. The backside surface 802 can be attached to the base die assembly 134 using the stacking attachment layer 128. The encapsulant 132 can optionally be applied over the stacking die 126 and the base die assembly 134.

Figure 9:
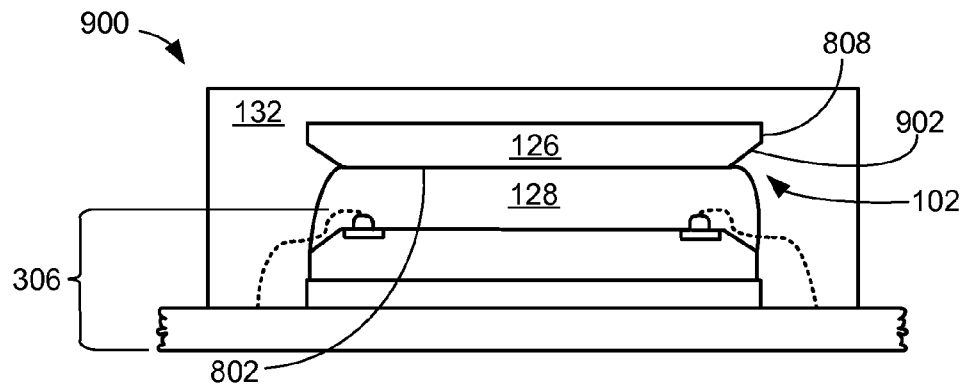
FIG. 9 is a cross-sectional view similar to FIG. 1 of an integrated circuit package system in a fifth embodiment of the present invention.

Referring now to FIG. 9, therein is shown a cross-sectional view similar to FIG. 1 of an integrated circuit package system 900 in a fifth embodiment of the present invention. The integrated circuit package system 900 can preferably include the base die assembly 306, the stacking attachment layer 128, and the stacking die 126 having the relief region 102 located adjacent the backside surface 802 of the stacking die 126. The backside surface 802 can be attached to the base die assembly 306 using the stacking attachment layer 128.

The relief region 102 can include an angled recess surface 902 from adjacent the stacking die side 808 to the backside surface 802. The angled recess surface 902 can be formed having a pre-determined angle oblique to the backside surface 802. The relief region 102 having the angled recess surface 902 can form a shaped cross-section having a triangular geometric form. The encapsulant 132 can optionally be applied over the stacking die 126 and the base die assembly 306.

Figure 10:
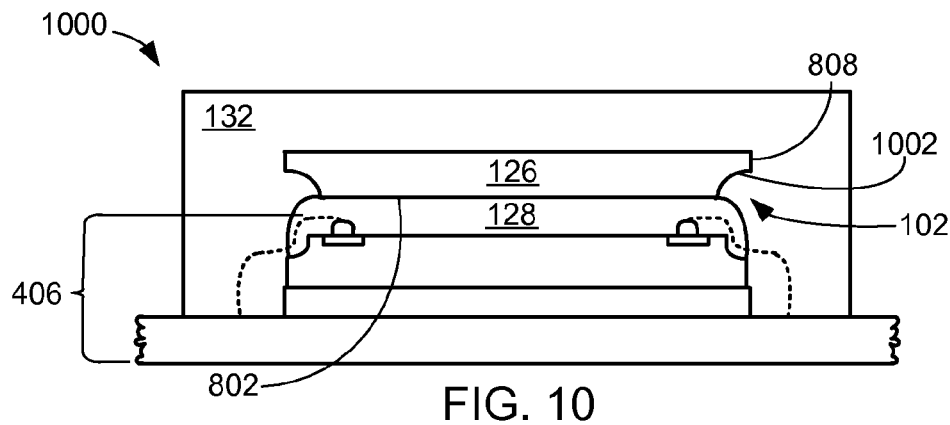
FIG. 10 is a cross-sectional view similar to FIG. 1 of an integrated circuit package system in a sixth embodiment of the present invention.

Referring now to FIG. 10, therein is shown a cross-sectional view similar to FIG. 1 of an integrated circuit package system 1000 in a sixth embodiment of the present invention. The integrated circuit package system 1000 can preferably include the base die assembly 406, the stacking attachment layer 128, and the stacking die 126 having the relief region 102 located adjacent the backside surface 802 of the stacking die 126. The backside surface 802 can be attached to the base die assembly 406 using the stacking attachment layer 128.

The relief region 102 can include an angled curved recess surface 1002 from adjacent the stacking die side 808 to the backside surface 802. The angled curved recess surface 1002 can be formed having a pre-determined angle oblique to the stacking die side 808. The angled curved recess surface 1002 can include having a surface curved into the stacking die 126 resulting in a depressed surface. The relief region 102 having the angled curved recess surface 1002 can form a shaped cross-section having a rounded geometric form.

The encapsulant 132 can optionally be applied over the stacking die 126 and the base die assembly 406.

Figure 11:
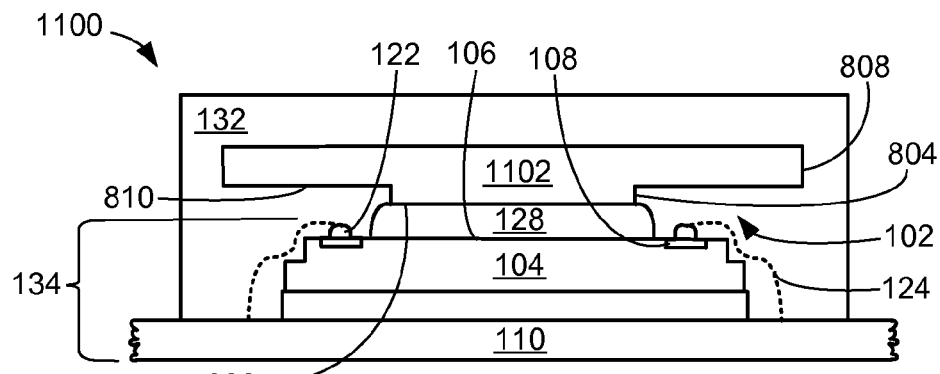
FIG. 11 is a cross-sectional view similar to FIG. 1 of an integrated circuit package system in a seventh embodiment of the present invention.

Referring now to FIG. 11, therein is shown a cross-sectional view similar to FIG. 1 of an integrated circuit package system 1100 in a seventh embodiment of the present invention. The integrated circuit package system 1100 can preferably include the base die assembly 134, the stacking attachment layer 128, and a stacking die 1102 having the relief region 102 located adjacent a backside surface 802 of the stacking die 1102. The backside surface 802 can be attached to the base die assembly 134 using the stacking attachment layer 128. The perimeter of the surface opposite the backside surface 802 of the stacking die 1102 can be substantially greater than the perimeter of the base die 104 of the base die assembly 134.

The bond pads 108, the stitch bond 122, the bond wires 124 of the base die assembly 134, and the relief region 102 are free of the stacking attachment layer 128 and portions of the active base surface 106 adjacent the bond pads 108 of the base die 104 are substantially free of the stacking attachment layer 128. The relief region 102 can include a vertical recess surface 804 parallel to a stacking die side 808 of the stacking die 1102. The relief region 102 can also include a horizontal recess surface 810 parallel to the backside surface 802.

The intersection of the vertical recess surface 804 and the horizontal recess surface 810 can form a line indicating a predetermined height the horizontal recess surface 810 is above the backside surface 802 and a predetermined length the vertical recess surface 804 is away from the stacking die side 808 nearest the vertical recess surface 804. The predetermined length the vertical recess surface 804 is from the stacking die side 808 can be substantially greater than the predetermined height the horizontal recess surface 810 is above the backside surface 802.

The relief region 102 having the vertical recess surface 804 and the horizontal recess surface 810 can form a shaped cross-section having a rectangular geometric form. The relief region 102, substantially free of the stacking attachment layer 128, can extend over the bond pads 108, the active base surface 106 adjacent the bond pads 108, the stitch bond 122, the bond wires 124, and portions of the substrate 110 adjacent the bond wires 124. The encapsulant 132 can optionally be applied over the stacking die 1102 and the base die assembly 134.

Figure 12:
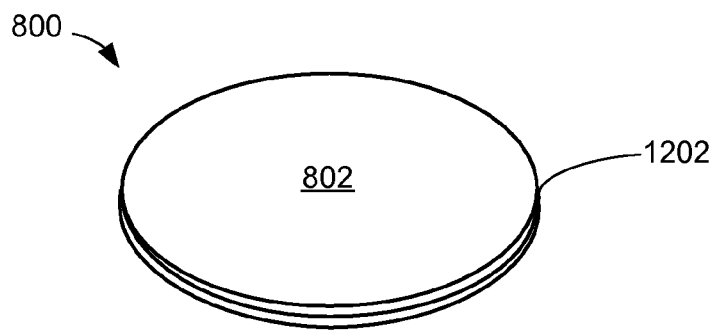
FIG. 12 is a schematic illustration of steps in the manufacture of the fourth embodiment.

Referring now to FIG. 12, therein is shown a schematic illustration of steps in the manufacture of the fourth embodiment. Shown is a wafer 1202 used to manufacture multiple replications of the stacking die 126 of FIG. 8. The side of the wafer 1202 having the backside surface 802 can preferably removed of material using a thinning process such as grinding, sanding, or similar removal method. This process step can reduce the thickness of the stacking die 126 and provide a conditioned surface which can improve adhesion characteristics with the stacking attachment layer 128 of FIG. 8.

Figure 13:
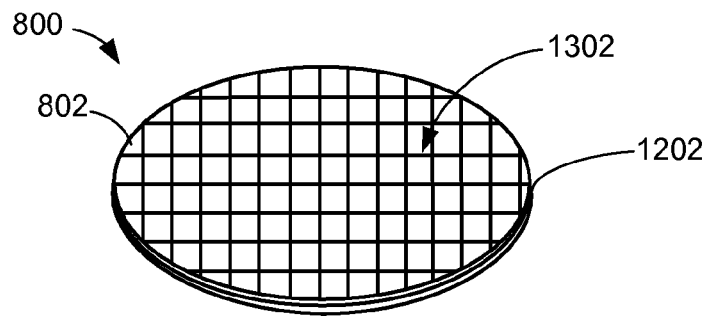
FIG. 13 is a schematic illustration of FIG. 12 in other steps in the manufacture of the fourth embodiment.

Referring now to FIG. 13, therein is shown a schematic illustration of FIG. 12 in other steps in the manufacture of the fourth embodiment. The backside surface 802 can be further processed using a rear dicing process along pre-determined grid coordinates 1302. The rear dicing process can preferably consist of a wide partial penetrating cut into the wafer 1202 and a narrow segregating cut resulting in singulation of the wafer 1202 along the pre-determined grid coordinates 1302.

The rear dicing process can result in the formation of the stacking die 126 and the relief region 102 of the stacking die 126 of FIG. 8. Continuation of the rear dicing process can result in multiple replications of the stacking die 126 diced and available for individual unit assembly and integration.

Figure 14:
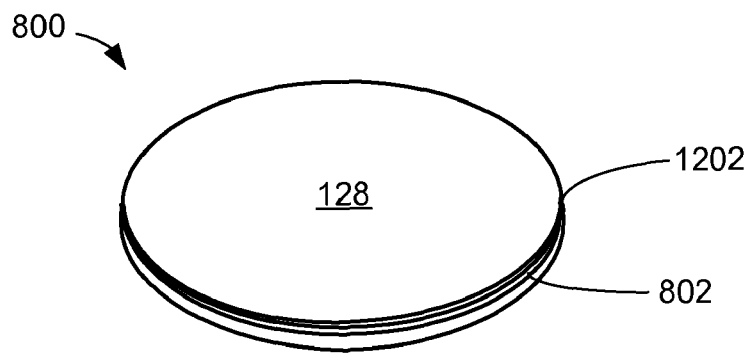
FIG. 14 is a schematic illustration of FIG. 12 in other steps in the manufacture of the fourth embodiment.

Referring now to FIG. 14, therein is shown a schematic illustration of FIG. 12 in other steps in the manufacture of the fourth embodiment. The backside surface 802 having previously removed of material using the thinning process of FIG. 12 can be layered with the stacking attachment layer 128. The stacking attachment layer 128 can be applied over the backside surface 802 of the wafer 1202.

Figure 15:
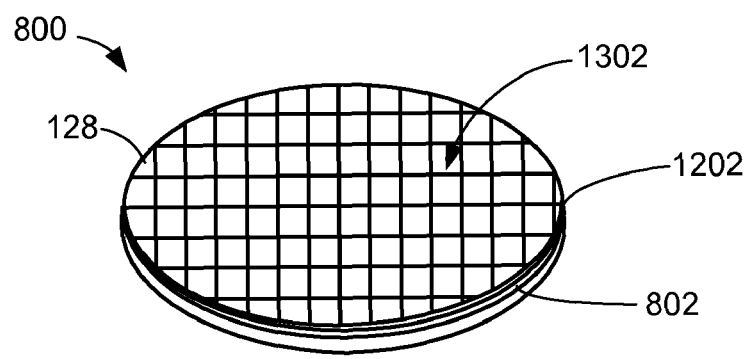
FIG. 15 is a schematic illustration of FIG. 14 in other steps in the manufacture of the fourth embodiment.

Referring now to FIG. 15, therein is shown a schematic illustration of FIG. 14 in other steps in the manufacture of the fourth embodiment. The stacking attachment layer 128 on the backside surface 802 can be further processed using a rear dicing process along the pre-determined grid coordinates 1302. The rear dicing process can preferably consist of a wide partial penetrating cut into the wafer 1202 and a narrow segregating cut resulting in singulation of the wafer 1202 along the pre-determined grid coordinates 1302.

The rear dicing process can result in the formation of the stacking die 126 and the relief region 102 of the stacking die 126 of FIG. 8. Continuation of the rear dicing process can result in multiple replications of the stacking die 126 having the stacking attachment layer 128 diced and available for individual unit assembly and integration.

Figure 16:
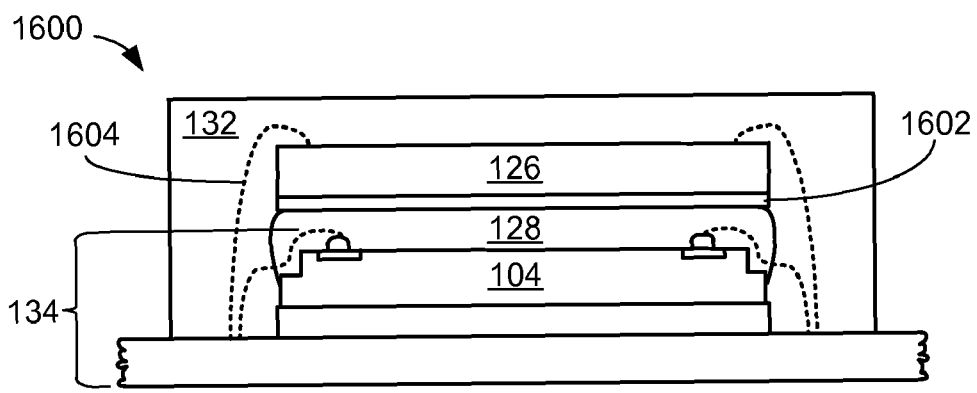
FIG. 16 is a cross-sectional view similar to FIG. 1 of an integrated circuit package system in an eighth embodiment of the present invention.

Referring now to FIG. 16, therein is shown a cross-sectional view similar to FIG. 1 of an integrated circuit package system 1600 in an eighth embodiment of the present invention. The integrated circuit package system 1600 can preferably include the base die assembly 134 having the base die 104, the stacking die 126, the stacking attachment layer 128, an insulation layer 1602, and bond wires 1604. The insulation layer 1602 can be attached over the base die assembly 134 using the stacking attachment layer 128.

The stacking die 126 can mounted on the insulation layer 1602 over the stacking attachment layer 128 and circuitry of the stacking die 126 can connect to the base die assembly 134 using bonding wires 1604. The encapsulant 132 can optionally be applied over the stacking die 126, the bond wires 1604, and the base die assembly 134.

Figure 17:
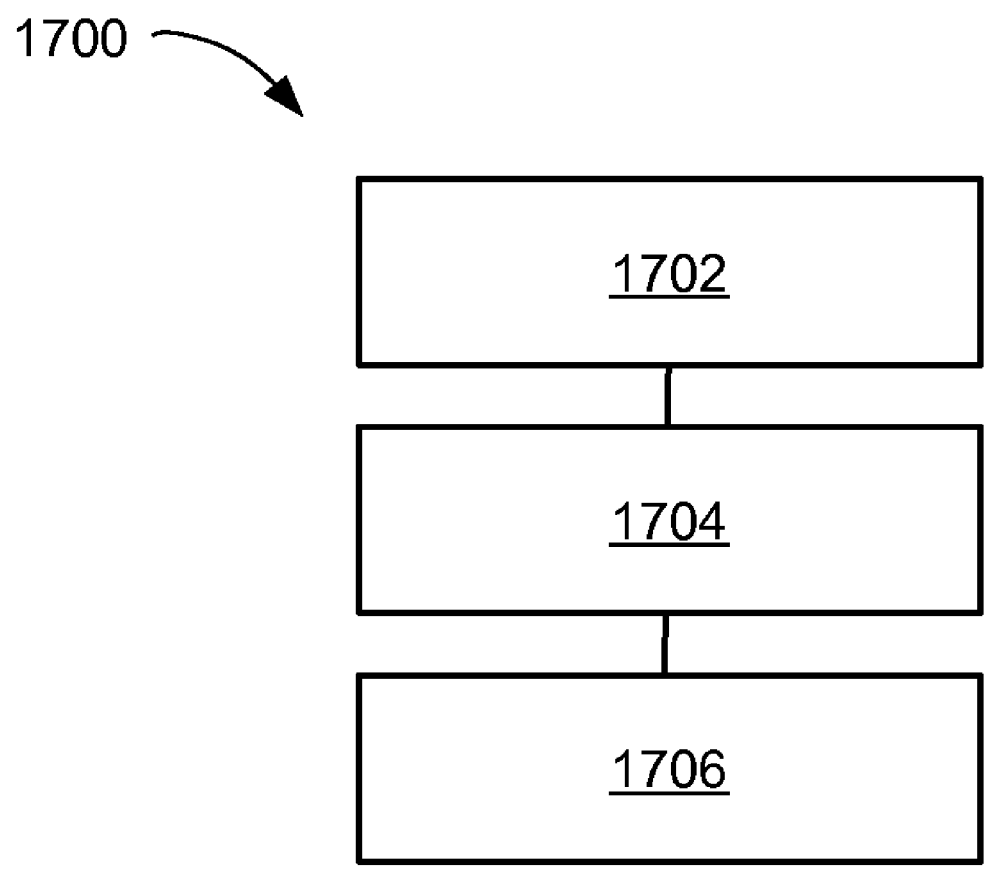
FIG. 17 therein is shown a flow chart of an integrated circuit package system for manufacturing the integrated circuit package system in an embodiment of the present invention.

Referring now to FIG. 17, therein is shown a flow chart of an integrated circuit package system 1700 for manufacturing the integrated circuit package system in an embodiment of the present invention. The system 1700 includes providing a substrate in a block 1702; attaching a base die to the substrate, the base die having a relief region with a shaped cross-section in a block 1704; and connecting a bond wire between an active base surface of the base die and the substrate, the bond wire extending through the shaped cross-section of the relief region in a block 1706.

In greater detail, a system to provide the method and apparatus of the integrated circuit package system 100, in an embodiment of the present invention, is performed as follows:

1. Providing a substrate having an active substrate surface.
2. Attaching a base die to the substrate, the base die having a relief region with a shaped cross-section around the perimeter thereof.
3. Connecting a bond wire between an active base surface of the base die and the substrate, at least one of the bond wires extending through the shaped cross-section of the relief region.

Thus, it has been discovered that the integrated circuit package system method and apparatus of the present invention furnish important and heretofore unknown and unavailable solutions, capabilities, and functional aspects.

The resulting processes and configurations are straightforward, cost-effective, uncomplicated, highly versatile and effective, can be implemented by adapting known technologies, and are thus readily suited for efficiently and economically manufacturing large die IC packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
    providing a substrate;
    attaching a base die to the substrate, the base die having a relief region with a shaped cross-section; and
    connecting a bond wire between an active base surface of the base die and the substrate, the bond wire extending through the shaped cross-section of the relief region.

2. The method as claimed in claim 1 wherein connecting the bond wire includes stitch bonding between the active base surface of the base die and the substrate, the bond wire extending through the shaped cross-section of the relief region.

3. The method as claimed in claim 1 wherein attaching the base die to the substrate, the base die having the relief region with the shaped cross-section, the relief region with the shaped cross-section is shaped as a rectangle, a triangle, or a curve.

4. The method as claimed in claim 1 further comprising:
    mounting a stacking die over the base die; and
    attaching a stacking attachment layer between the stacking die and the base die, the stacking attachment layer covering a portion of the bond wire.

5. The method as claimed in claim 1 further comprising mounting a stacking die over the base die, the stacking die having a relief region with a shaped cross-section extending over the connection of the bond wire to the active base surface of the base die.

6. A method for manufacturing an integrated circuit package system comprising:
    providing a substrate having an active substrate surface;
    attaching a base die to the substrate, the base die having a relief region with a shaped cross-section around the perimeter thereof; and
    connecting a bond wire between an active base surface of the base die and the substrate, the bond wire extending through the shaped cross-section of the relief region.

7. The method as claimed in claim 6 further comprising a stitch bond connecting the bond wire parallel to the active base surface of the base die.

8. The method as claimed in claim 6 further comprising:
    mounting a stacking die over the base die; and
    attaching an insulation layer on the stacking die, the insulation layer between the stacking die and the base die.

9. The method as claimed in claim 6 further comprising:
    mounting a stacking die over the base die, the stacking die having a relief region with a shaped cross-section;
    attaching a stacking attachment layer between the stacking die and the base die, the stacking attachment layer covering a portion of the bond wire; and
  wherein:
    connecting the bond wire between the active base surface of the base die and the substrate, the bond wire extending through the shaped-cross section of the relief region of the stacking die.

10. The method as claimed in claim 6 further comprising mounting a stacking die over the base die, the stacking die having a relief region with a shaped cross-section extending over portions of the active base surface, the bond wire, and portions of the substrate adjacent the bond wire.

11. An integrated circuit package system comprising:
    a substrate;
    a base die attached to the substrate, the base die having a relief region with a shaped cross-section; and
    a bond wire connected between an active base surface of the base die and the substrate, the bond wire extended through the shaped cross-section of the relief region.

12. The system as claimed in claim 11 wherein the bond wire includes stitch bonding connected between the active base surface of the base die and the substrate, the bond wire extended through the shaped cross-section of the relief region.

13. The system as claimed in claim 11 wherein the base die is attached to the substrate, the base die having the relief region with the shaped cross section, the relief region with the shaped cross-section is shaped as a rectangle, a triangle, or a curve.

14. The system as claimed in claim 11 further comprising:
a stacking die mounted over the base die; and
a stacking attachment layer to attach the stacking die with the base die, the stacking attachment layer covers a portion of the bond wire.

15. The system as claimed in claim 11 further comprising a stacking die mounted over the base die, the stacking die having a relief region with a shaped cross-section extended over the connection of the bond wire to the active base surface of the base die.

16. The system as claimed in claim 11 wherein:
the substrate having an active substrate surface;
the base die attached to the substrate, the base die having the relief region with the shaped cross-section around the perimeter thereof; and
the bond wire connected between the active base surface of the base die and the substrate, the bond wire extended through the shaped cross-section of the relief region.

17. The system as claimed in claim 16 further comprising a stitch bond to connect the bond wire parallel to the active surface of the base die.

18. The system as claimed in claim 16 further comprising:
a stacking die mounted over the base die; and
an insulation layer attached on the stacking die, the insulation layer between the stacking die and the base die.

19. The system as claimed in claim 16 further comprising:
a stacking die mounted over the base die, the stacking die having a relief region with a shaped cross-section;
a stacking attachment layer to attach the stacking die with the base die, the stacking attachment layer covers a portion of the bond wire; and
wherein:
the bond wire connected between the active base surface of the base die and the substrate, the bond wire extends through the shaped-cross section of the relief region of the stacking die.

20. The system as claimed in claim 16 further comprising a stacking die mounted over the base die, the stacking die having a relief region with a shaped cross-section extended over portions of the active base surface, the bond wire, and portions of the substrate adjacent the bond wire.

* * * * *